United States Patent [19]

Buchoff

[11] Patent Number: 5,033,970
[45] Date of Patent: Jul. 23, 1991

[54] SELF-MOUNTED CHIP CARRIER

[75] Inventor: Leonard S. Buchoff, Huntingdon Valley, Pa.

[73] Assignee: Elastomeric Technologies, Inc., Hatboro, Pa.

[21] Appl. No.: 554,181

[22] Filed: Jul. 18, 1990

Related U.S. Application Data

[63] Continuation of Ser. No. 250,869, Sep. 29, 1988, abandoned, which is a continuation-in-part of Ser. No. 100,809, Sep. 24, 1987, abandoned.

[51] Int. Cl.⁵ .............................................. H01R 9/09
[52] U.S. Cl. ....................................... 439/66; 439/70; 439/91; 439/591
[58] Field of Search ......................... 439/66, 68–70, 439/74, 91, 591

[56] References Cited

U.S. PATENT DOCUMENTS

| | | | |
|---|---|---|---|
| 3,960,423 | 6/1976 | Weisenburger | 439/66 |
| 4,344,662 | 8/1982 | Dalamangas et al. | 439/91 |
| 4,445,735 | 5/1984 | Bonnefoy | 439/66 |
| 4,571,015 | 2/1986 | Mueller | 439/66 |
| 4,614,387 | 9/1986 | Hartl | 439/70 |
| 4,658,331 | 4/1987 | Berg | 439/66 |
| 4,710,134 | 12/1987 | Korsunsky | 439/70 |
| 4,793,814 | 12/1988 | Zifcak et al. | 439/66 |
| 4,820,170 | 11/1989 | Redmond et al. | 439/91 |
| 4,843,313 | 6/1989 | Walton | 439/66 |
| 4,850,883 | 7/1989 | Kabadi | 439/91 |

Primary Examiner—Paula A. Bradley
Attorney, Agent, or Firm—Ratner & Prestia

[57] ABSTRACT

A self-mounted chip carrier having a surface which contains the integrated circuit. This surface has a contact pad metallized area for contacting the integrated circuit. The self-mounted chip carrier is secured to a mating surface and aligned so that the pads on the chip carrier are aligned with the matching pads on a substrate for mating with the self-mounted chip carrier. Registration holes serve as a means for aligning the chip carrier. A compliant connector made of an elastomeric material is positioned between the chip carrier and the substrate to provide electrical connection. A lid is provided to serve as a deflection stop.

12 Claims, 2 Drawing Sheets

SELF-MOUNTED CHIP CARRIER

This application is a continuation of application Ser. No. 07/250,869, filed Sept. 29, 1988, now abandoned, which is a continuation-in-part application of U.S. patent application Ser. No. 100,809, filed Sept. 24, 1987, now abandoned, entitled "FLAT WIRE IN SILICONE RUBBER OR PICKET FENCE," the inventors of the subject matter being Dr. Leonard S. Buchoff and Mr. James K. Black.

FIELD OF THE INVENTION

The present invention relates to circuitry attachment devices and more particularly to an integrated circuit attachment apparatus and method comprising a self-mounted chip carrier with a means for positioning and clamping to a circuit and an elastomeric connector element seated on a chip carrier.

BACKGROUND OF THE INVENTION

In order to replace a defective unit or recover an expensive component from an otherwise operable circuit, it is desirable to easily insert and remove various units from a circuit board. Expensive and space consuming sockets which usually require plated through holes are often used to facilitate location and removal of particular components. On current chip carriers, having approximately 0.050" centers tolerances on the carrier and socket are sufficient to accommodate socketing. On the integrated circuit carriers (chip carriers) with leads on 0.025" centers, there are few sockets on the market which can satisfactorily perform such location and removal of components. These sockets require very tight tolerance carriers and must sometimes be optically aligned. Unfortunately, it is very difficult to obtain sockets which will contact high density circuits and many new circuits today are surface mounted and have no plated through holes to accept normally leaded devices.

The current technology maintains the integrated circuits on chips on substrates of either ceramic, laminate or plastic and solders these carriers to the circuit boards directly or through resilient leads. As board spacing becomes closer, i.e., less than 0.050 inches on centers of the contacts, soldering components become difficult as individual leads become misaligned and solder bridging becomes a serious problem. Also, the heat of soldering can ruin temperature sensitive parts on printed circuit boards. As board spacing is being reduced to 0.025" centers and chip carriers with centers of 0.012" are in the design stages, the soldering problem becomes more acute and must be addressed to maintain pace with the increasing efficiency of the electronic industries.

Because of these and other problems associated with the prior art, it is an object of the present chip carrier to provide a device requiring minimal board space.

Another object of the invention is to accommodate chip carrier contact spacing closer than on 0.025 inch centers.

A further object of the chip carrier is to provide ease of field replacement at a low cost.

Additionally, an object of the invention is the ability to manufacture and test such chip carriers automatically.

SUMMARY OF THE INVENTION

To achieve these and other objects of the invention, applicant has created a self-mounted integrated circuit carrier (chip carrier), comprising a contact pad metallized chip carrier substrate containing the integrated circuit and registration holes located in diametrically opposed corners of the substrate for aligning and securing the carrier to the circuit board. The invention differs from prior art chip carriers by employing a compliant, elastomeric (connector element) ring. This ring could be made of "STAX," ™ "MOE," ® or "Matrix MOE," and positioned between the carrier and the circuit board to act as an intermediary for making contact between contact areas on the chip carrier and on the circuit board. In addition to the use of the STAX or MOE ring, individual linear elements can also be used in configuration with the self-mounted chip carrier.

A prime advantage of the present invention is that despite its unique capabilities, the cost of the units described are comparable to present chip carriers and are significantly less expensive than a chip carrier plus holder, because the expense of the socket is eliminated. Furthermore, these units occupy minimal board area and have a very low profile as the large socket is absent. Also, leads on centers as close as 0.010" may be reliably handled, and heat sinking could be incorporated into the package easily.

Other attributes of the self-mounted chip carrier include automatic production, low cost, excellent high frequency performance, ease of field replacement, and the possibility of automatic assembly.

Automatic production is facilitated by the potential of sequentially performing the manufacturing steps while the chip carriers are in a precise array on a monolithic substrate. Also, the lead attachment operation required by other technologies are absent. Gang testing of the populated carriers contributes most to the feasibility of automatic production. Cost is reduced by eliminating the expense of a separate socket and the time and expense of the socket attachment operation.

Excellent high frequency operation results from the very short connection path, low capacitance and low inductance. These produce shorter time delays and a minimum of signal distortion in the gigahertz frequency range.

Field replacement is facilitated by the alignment holes which aid the accurate installation of the self mounting chip carrier with a minimum of skill and specialized tools. Also, the elastomeric connecting elements are pre-assembled onto the carrier with only pressure needed to affect reassembly. Leads are not unsoldered and resoldered as they are with some competing technologies.

Automatic assembly of the chip carriers onto printed wiring boards by automatic insertion equipment is facilitated by the alignment holes and pre-assembled elastomeric elements. Simply applying a clamping force completes the assembly operation.

The self-mounted chip carriers may be made and tested in a highly automated way. By this procedure, the chip carrier bodies are formed in a ceramic or plastic matrix similar to the standard way of producing ceramic chip carriers. The advantage lies in the ability to install the chips in the carriers, while still in the matrix and to attach the protective covers and test rapidly and economically using the elastomeric elements to contact the test interface.

DETAILED DESCRIPTION OF THE PREFERRED EMBODIMENT

Figure 1:
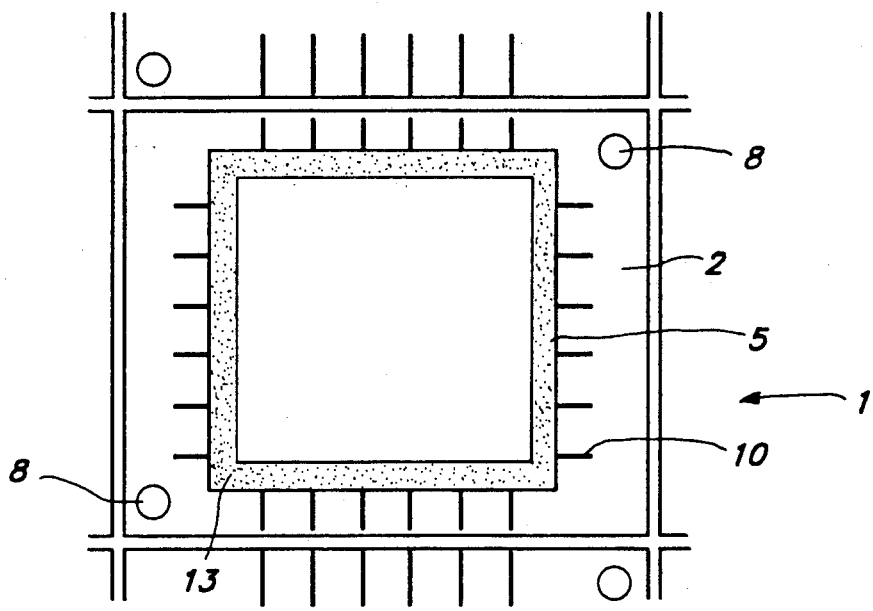
FIG. 1 is a plan view of the self-mounted chip carrier.
Figure 2:
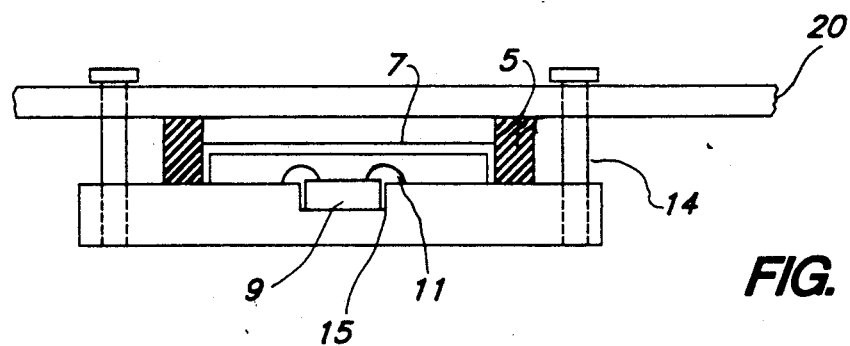
FIG. 2 is a cross sectional view at lines A—A of the self-mounted chip carrier of FIG. 1.
Figure 3:
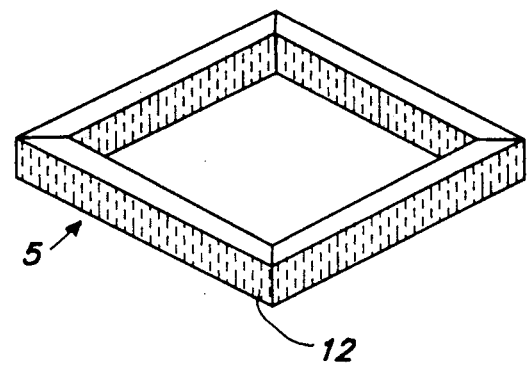
FIG. 3 is a perspective view of a MOE or STAX ring onto which the MOE or STAX ring is placed.
Figure 4:
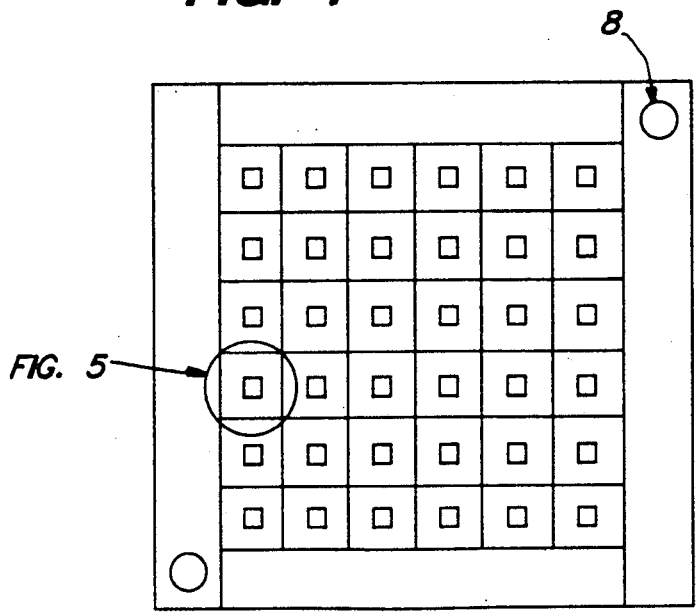
FIG. 4 is a plan view of various matrices of substrates.
Figure 5:
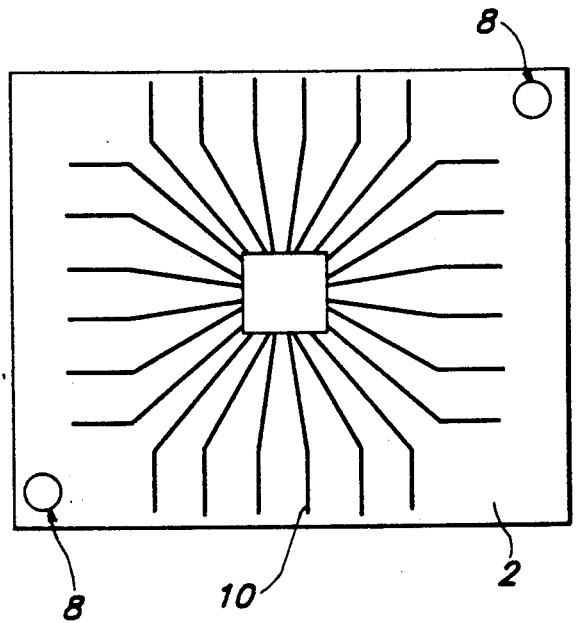
FIG. 5 is an enlarged plan view of a sample substrate.

Referring now to the drawings wherein like numerals indicate identical parts throughout the several views, electronic carrier and self-mounted chip carrier 1 is generally shown, comprising rectangular substrate surface 2 with contacts 10 on the surface. Contact pads 10 comprise individual grid lines which are aligned in two directions generally perpendicular to each other, although other configurations, as shown in FIG. 5 may be used. Substrate surface 2 further comprises registration holes 8 located at diametrically opposed corners of substrate 2 for proper alignment and securing of the carrier to an electronic substrate surface. These registration holes 8 may be located in different positions other than as shown in FIG. 4. Shouldered bolts 14, inserted into registration holes 8 are used for proper alignment of substrate 2. In one way of mass producing the carriers substrate 2 sits in an array of substrates as shown in FIG. 4.

The substrate 2 of the self-mounted chip carrier 1, can be made from a ceramic, laminate, molded plastic or other suitable material. The conductive pads 10 on the substrate are applied by thick film screening, thin film techniques, additive plating, or subtractive methods and would be accurately positioned by the registration holes 8 at its diametrically opposed ends. A hold-down mechanism such as the shouldered screws 14, apply the pressure required to mate the carrier 1 to the electronic substrate 20 (such as a printed circuit board). The screws 14 may operate in conjunction with an elastic or spring member (not shown) which helps distribute the load on the carrier substrate 2. This hold-down mechanism may be integrated into the heat sink structure. This would be done by attaching the hold down screws to the heat sink. Thus, the heat sink would be mounted onto the chip carrier in the normal way, but the attached screws would fit into the alignment holes. The heat sink body would distribute the hold down load over the chip carrier surface.

The chip carrier body 2 has features on it which facilitate aligning contacts 10 on the chip carrier 1 with traces on the electronic circuit, e.g., print wiring board, hybrid, or multiwire. Examples of these features are holes to match posts on the circuit or posts to match holes. These features can be part of the main body 2 of the chip carrier 1 or another attached member.

Various means are provided to hold an elastomeric element 5 onto the chip carrier 1 to provide connection between the chip carrier pads 10 and matching pads (not shown) on the circuit. These means include having an extended area (not shown) of the chip carrier 1 to serve as a holder, or soldering MOE ring 5, to the carrier pads 10 or the elements can simply be adhesively attached.

An elastomeric connector ring 5 (MOE, MATRIX MOE or STAX ring) generally comprises various metallic particles or flat wires 13 imbedded into the parallel horizontal layers 12 of the elastomeric material or flat wires on the elastomer surface. The elastomeric ring 5 generally circumscribes a lid 7 which serves as a stop to prevent deflection of the MOE ring 5 and to protect a chip (integrated circuit) 9.

The chip 9 rests in a cut out portion 15 on the carrier 1. Wires 11 project up and outwardly from chip 9 to contact pads 10 on the surface of substrate 2.

In another embodiment of this invention, a heat sink could be attached directly to the package and holes drilled through the heat sink would serve as the positioning holes.

While the preferred embodiment of the invention has been illustrated in detail, modifications and adaptations of that embodiment will be apparent to those skilled in the art. However, it is to be expressly understood that such modifications and adaptations are within the spirit and scope of the present invention, as set forth in the following claims.

I claim:

1. A self-mounted chip carrier, comprising:
   a surface containing the integrated circuit and having a contact pad metallized area;
   a registration means for securing said carrier to a mating substrate and for aligning a mating pad on the chip carrier with a mating pad on the substrate, said registration means located away from the contact pad metallized area;
   a compliant connector between the carrier and the substrate, said connector made from an elastomeric material; and
   a lid serving as a deflection stop.

2. The self-mounted chip carrier of claim 1, wherein said positioning means comprises bolt members.

3. The self-mounted chip carrier of claim 2, wherein said bolt members are shouldered.

4. The self-mounted chip carrier of claim 3, wherein said bolt members are located in diametrically opposed corners of said surface.

5. The self-mounted chip carrier of claim 4, wherein said means for securing is a shouldered screw.

6. The self-mounted chip carrier of claim 5, wherein said elastomeric connector comprises a plurality of linear strips.

7. The self-mounted chip carrier of claim 5, wherein said elastomeric connector is a metal-on-elastomer ring.

8. The self-mounted chip carrier of claim 7, wherein said metal-on-elastomer ring is configured in a matrix formation.

9. The self-mounted chip carrier of claim 5, wherein said elastomeric connector is metallic.

10. The self-mounted chip carrier of claim 9, wherein said elastomeric connector is adapted to fit into spaces in a molded ring.

11. A self-mounted chip carrier, comprising
   a contact pad metallized substrate containing an integrated circuit;
   registration holes on diametrically opposed ends of the substrate;
   shouldered bolt members, adapted to fit into said holes, for aligning and securing the carrier to an electronic substrate;
   a compliant elastomeric metal-on-elastomer ring configured in a matrix formation, wherein said ring contacts said contact pad; and a lid to retain said chip in position and to decrease deflection of said metal-on-elastomer ring.

12. An electronics assembly comprising:

a chip carrier having a first set of contacts and a first set of alignment holes and including an integrated circuit positioned in the surface on which said first set of contacts is positioned;

an electronic substrate having a second set of contacts and a second set of alignment holes;

compliant connecting means positioned between said chip carrier and said electronic substrate for connecting selected contacts of said first set of contacts to selected contacts of said second set of contacts, said compliant connecting means including a ring of elastomeric elements;

a lid positioned to protect said integrated circuit and fitted within said ring of elastomeric elements to restrict inward deflection of said ring of elastomeric elements; and a plurality of screws each extending through an alignment hole in said chip carrier and an alignment hole in said electronic substrate for aligning said first set and said second set of contacts and assembling said chip carrier and said electronic substrate with said selected contacts connected by said compliant connecting means.

* * * * *